United States Patent
Park et al.

(10) Patent No.: US 7,016,211 B2
(45) Date of Patent: Mar. 21, 2006

(54) DRAM-BASED CAM CELL WITH SHARED BITLINES

(75) Inventors: Kee Park, San Jose, CA (US); Robert J. Proebsting, Sonora, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 10/921,760

(22) Filed: Aug. 18, 2004

(65) Prior Publication Data

US 2005/0152199 A1 Jul. 14, 2005

Related U.S. Application Data

(60) Provisional application No. 60/496,346, filed on Aug. 18, 2003.

(51) Int. Cl.
*G11C 15/00* (2006.01)
(52) U.S. Cl. .................. 365/49; 365/149; 365/189.03; 365/230.05
(58) Field of Classification Search ............... None
See application file for complete search history.

(56) References Cited

U.S. PATENT DOCUMENTS 5,189,640 A * 2/1993 Huard ....................... 365/154
6,353,552 B1 * 3/2002 Sample et al. .............. 365/154

* cited by examiner

*Primary Examiner*—Tan T. Nguyen
(74) *Attorney, Agent, or Firm*—Bever, Hoffman & Harms

(57) ABSTRACT

A CAM cell is disclosed that includes a comparator and two three-transistor (3T) DRAM cells connected to a pair of associated bit lines. Data is stored using intrinsic capacitance of each 3T DRAM cell, and is applied to the gate terminal of a pull-down transistor of the comparator. During refresh operations, inverted data values are written onto the bit lines, and subsequently written from the bit lines to the 3T DRAM cells. In ternary embodiments, an inverting refresh circuit is used to re-invert the inverted data values prior to being written to the 3T DRAM cells. In one embodiment, the 3T DRAM cells are cross-coupled to the bit lines, and the inverting refresh circuit transfers bits from one bit line to the other.

24 Claims, 7 Drawing Sheets

DRAM-BASED CAM CELL WITH SHARED BITLINES

RELATED APPLICATIONS

This application is claims priority of U.S. Provisional Patent Application 60/496,346, entitled "Dram-Based CAM Cell Array With Shared Bit Lines" filed Aug. 18, 2003.

FIELD OF THE INVENTION

The present invention relates to integrated circuit content addressable memories (CAMs). More specifically, the present invention relates to dynamic random-access-memory-based (DRAM-based) CAMs.

BACKGROUND OF THE INVENTION

Conventional read-write or "random access" memories (RAMs) include RAM cells arranged in rows and columns, and addressing circuitry that accesses a selected row of RAM cells using address data corresponding to the physical address of the RAM cells. That is, data words stored in the rows of conventional RAM cells are accessed by applying address signals to the RAM input terminals. In response to each write or read command a RAM receives, a data word is written to or read from a portion of the RAM array designated by the address.

In addition to the read-write capability of conventional RAMs, content addressable memories (CAMs) include memory cells that are selected in response to their content. Specifically, a CAM receives a (search key) data value that is compared with all of the (entry) data values stored in the many rows of the CAM. In response to each unique (search term) data value applied to the CAM input terminals, the rows of CAM cells within the CAM assert or de-assert associated match signals indicating whether or not the stored (entry) data values in that respective row of CAM cells matches the (search key) data value being searched by and applied to the CAM. CAMs are useful in many applications, such as search engines.

Similar to conventional RAM devices, CAM devices can either be formed utilizing dynamic random access memory (DRAM) cells, in which data values are stored using capacitors, or formed utilizing static random access memory (SRAM) cells, in which data values are stored using bistable flip flops.

FIG. 10 is a circuit diagram showing a conventional dynamic-based (DRAM-based) CAM cell 10, which includes a pair of one-transistor (1T) DRAM cells 12 and 16, and a four-transistor comparator circuit 14 made up of transistors Q3 through Q6. Each 1T DRAM cell 12 and 16 stores one bit of a two-bit data value that is compared with a two-bit data value transmitted on data lines D1 and D1-bar during search operations. DRAM cell 12 includes access transistor Q1 and a capacitor structure C1, which combine to form a storage node a that stores a first bit of data, and applies the stored data bit to the gate terminal of transistor Q3 of comparator circuit 14. Transistor Q3 is connected in series with transistor Q4, which is controlled by a data signal transmitted on inverted data line D1-bar, between a match line MATCH and a discharge line DISCHARGE. A second DRAM cell 16 includes access transistor Q2 and a capacitor structure C2, which combine to form a storage node b that stores a second data bit, and applies the stored data value to the gate terminal of transistor Q5 of comparator circuit 14. Transistor Q5 is connected in series with transistor Q6, which is controlled by a data signal transmitted on true (non-inverted) data line D1, between the match line and the discharge line.

During a data write operation (or during the write phase of a refresh operation), a data value to be stored is written to dynamic storage nodes a and b by applying appropriate voltage signals (e.g., VCC or ground) on bit lines BL1 and BL2, and then applying a high voltage signal on write word lines WL1 and WL2, which may be combined to form a single word line. The high voltage on write word lines WL1 and WL2 turn on transistor Q1 and Q2, thereby passing the voltage signals (data to be stored) to dynamic storage nodes a and b without Vt loss due to NMOS threshold voltage. Because the voltage signals are stored using capacitors C1 and C2 and the charge slowly leaks off, the stored data value decays over time. Refresh circuitry is required that periodically reads and rewrites (refreshes) the stored data value before it is lost.

This CAM cell can stores three different states, "1", "0", or "masked" (don't care). When the CAM cell stores the data value "1", node "a" stores "1" and node "b" stores "0". When the CAM cell stores the data value "0", node "a" stores "0" and node "b" stores "1". When the CAM cell is in masked (don't care) state, both node "a" and "b" store "0". The data value stored at storage nodes a and b is applied to the gate terminals of transistors Q3 and Q5 of comparator circuit 14. Comparator circuit 14 is utilized to perform match (comparison) operations by precharging a match line MATCH and transmitting an applied data value on data lines D1-bar and D1 to the gate terminals of transistor Q4 and Q6, respectively. A no-match condition is detected when match line MATCH is discharged to ground through the signal path formed by transistors Q3 and Q4, or through the signal path formed by transistors Q5 and Q6 in any CAM cell connected to the match line. For example, when the stored data bit is "1", which means node "a" is "1" and node "b" is "0", and the applied data signal is "0", which means D1 is "0" and D1-bar is "1", then both NMOS transistors Q3 and Q4 are turned on because both gate inputs, "a" and "D1-bar", are logic "1", to discharge match line MATCH to discharge line DISCHARGE when discharge line DISCHARGE is driven to a low voltage (e.g., ground). When a match condition occurs, match line MATCH remains in its precharged state (i.e., no signal path is formed by transistors Q3 and Q4, or transistors Q5 and Q6 in any of the CAM cells connected to the match line).

A problem with DRAM-based CAM 10 arises because of the construction of the capacitor C1 and C2 using a special multi-layer polysilicon fabrication process that significantly increases fabrication time and expense, which reduces the cost efficiency of smaller cell size. In addition to time and cost problems, thermal process step during polysilicon process reduces the transistor performance.

More significantly, conventional DRAM-based CAM cell 10 is limited in that a match (lookup or search) operation performed by comparator circuit 14 will be disturbed by a simultaneous read or refresh operation. When conventional DRAM cells 12 and 16 are refreshed (or read), the voltage on the storage node (a or b) initially shares its (positive or negative) charge with its associated bit line, which is precharged to about half of Vcc. If data in the cell is "1", the voltage levels on both storage node and bit line after charge sharing become slightly higher than initial precharge level of bit line. If data in the cell is "0", the voltage levels on both storage node and bit line after charge sharing become slightly lower than initial precharge level of bit line. The slight increase or decrease in bit line voltage is detected and amplified by a sense amplifier (not shown), which in turn drives the bit line high or low as needed to return the storage capacitor of the memory cell to its initial (undecayed) voltage. Between the time the charge from the storage capacitor is transferred to the bit line and the time the charge (voltage) is restored, comparator circuit 14 cannot be used for search operations because the voltage on the storage nodes (a and b) are about one-half of the system voltage, rather than being its normal logic level (i.e., either the system voltage or ground voltage). That is, the periodic refreshing needed by DRAM cells 12 and 16 interrupts search or lookup operations.

Accordingly, what is needed is a CAM cell that provides a size (cost) advantage over that provided by a SRAM-based CAM cell, but avoids the problems associated with conventional DRAM-based CAM cells.

SUMMARY OF THE INVENTION

The present invention is directed to DRAM-based ternary (ternary CAM cells store a "1", a "0", or a "don't care" which is called "masked") CAM cells that overcome the problems associated with conventional CAM cells by utilizing a pair of three-transistor (3T) DRAM cells and only two pairs of bit lines to facilitate refresh, read, and write operations, where a read port of each DRAM is coupled to a write port of either DRAM via the bit bines. A compare circuit and a second pair of data (bit) lines allow search (compare) operations to occur simultaneously with read, write, or refresh operations. By using 3T DRAM cells and only two bit line pairs, less substrate area is required to fabricate each CAM cell, when compared to conventional CAM cells utilizing larger SRAM memory cells and/or DRAM memory cells utilizing more than two bit line pairs for the read, write and restore functions. By allowing refresh operations to be performed simultaneously with search operations, CAM arrays of the present invention allow uninterrupted search operations, whereas, with conventional 1T DRAM CAM arrays, simultaneous search and refresh operations are not possible.

In accordance with the embodiments disclosed herein, a CAM cell array includes DRAM-based CAM cells arranged in rows and columns, with each column of CAM cells being connected to an associated pair of bit lines and an associated pair of data lines, and each row of CAM cells being connected to an associated match line, an associated write word line, an associated read word line, and an associated discharge line. Each of these signal lines is controlled using well-known techniques to produce the operations described below.

In accordance with a first embodiment of the present invention, a ternary CAM array is disclosed that includes an array of ten transistor (10T) DRAM-based CAM cells. Each CAM cell includes a pair of 3T DRAM cells, a true cell and a complementary cell, for storing two data value (i.e., a two-bit value representing a logic "1" (storage nodes are high for true cell, low for complementary cell), a logic "0" (storage nodes are low for true cell, high for complementary cell), or a mask value (storage nodes are low for true cell, low for complementary cell)), and a four transistor comparator circuit that discharges a match line when the (unmasked) data value stored by the 3T DRAM cells is not equal to an applied (unmasked) data value provided from an external source. Each 3T DRAM cell is connected to an associated bit line, and each of these bit lines is connected to an inverting refresh circuit, and to a precharge circuit. Each 3T DRAM cell includes a write transistor connected between its associated bit line and a storage node, a pull-down transistor having one terminal connected to ground and a gate terminal connected to the storage node, and a read transistor connected between a second terminal of the pull-down transistor and the same bit line that is connected to the write transistor. The storage node of the first transistor is also connected to a first terminal of the comparator (specifically, to the gate terminal of a pull-down transistor, which is connected in series with a second transistor that is controlled by an applied data value). During refresh, the read transistor is turned on to pass an inverted data signal (i.e., the logical inverse of the data bit stored at the storage node) onto the bit line, which had been precharged high by the precharge circuit. The inverted data signal is then re-inverted by the inverting refresh circuit (at one end of the column of CAM cells), and the write transistor is then turned on to pass the re-inverted data signal from the bit line to the storage node. The read and restore portions of the refresh operation are performed without ever compromising the voltage level of the stored data bit allowing search to occur during refresh operations. This is possible because the stored data bit is only used to control pull-down transistors of the 3T DRAM cell and of the comparator, thereby avoiding the charge sharing problems associated with 1T DRAM cells, and allowing increased bit line lengths (i.e., array size).

In accordance with a second embodiment of the present invention, each 10T DRAM-based CAM cell of a ternary CAM array includes a pair of 3T DRAM cells for storing a two-bit data value, and a four-transistor comparator circuit, which are constructed similar to the arrangement of the first embodiment (described above). However, unlike the first embodiment, each 3T DRAM cell is cross-coupled to the associated pair of bit lines. Specifically, the write transistor of a first 3T DRAM cell is connected to the first bit line, and the read transistor of the first 3T DRAM cell is connected to the second bit line. Conversely, the write transistor of a second 3T DRAM cell is connected to the second bit line, and the read transistor of the second 3T DRAM cell is connected to the first bit line. In addition, an inverting refresh circuit includes first and second portions that pass inverted data signals between the pair of associated bit lines during refresh operations. That is, a first portion of the inverting refresh circuit reads and inverts a data signal from the first bit line, and then transmits the inverted data signal to the second bit line. Conversely, the second portion of the inverting refresh circuit reads and inverts a data signal from the second bit line, and then transmits the inverted data signal to the first bit line. In addition to providing the benefits associated with the first embodiment, the second embodiment reduces power consumption by reducing bit line cycling during the refresh operation.

In accordance with a third embodiment of the present invention, a binary CAM array includes the cross-coupled, 10T DRAM-based CAM cells, but omits the inverting refresh circuits.

In yet another embodiment of the present invention, a DRAM memory array includes pairs of 3T DRAM cells that are cross-coupled in the manner described in the third embodiment, but omits the comparator circuit utilized to perform CAM functions.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
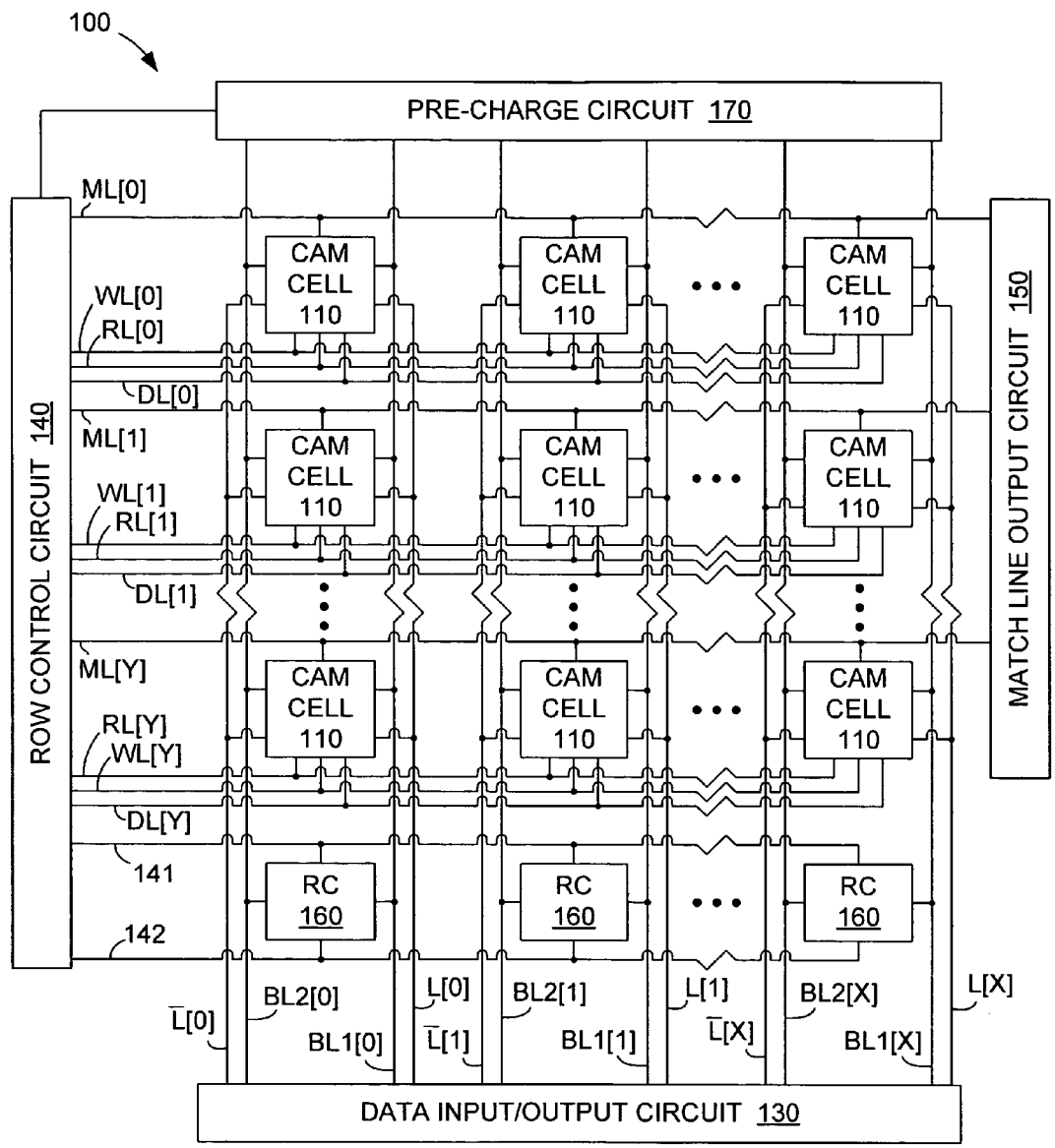
FIG. 1 is a simplified schematic diagram showing a generalized CAM cell array including CAM cells in accordance with some of the embodiments of the present invention.

FIG. 1 is a simplified schematic diagram showing a generalized CAM cell array 100 in accordance with embodiments of the present invention that are disclosed in additional detail below. CAM cell array 100 includes multiple DRAM-based CAM cells 110 arranged in rows and columns. Each column of CAM cells 110 is connected to an associated pair of bit lines BL1 and BL2, and an associated pair of lookup lines L and L-bar (the suffix "-bar" is utilized herein to indicate a complementary signal line). The bit lines are used to read or write the cells, and the lookup lines communicate data to be searched or looked up. Both pairs of lines are controlled by a data input/output circuit 130, which is constructed in accordance with known techniques to generate the operation control signals described below. Similarly, each row of CAM cells 110 is connected to an associated match line ML, an associated write word line WL, an associated read word line RL, and an optional associated discharge line DL, which are controlled by a row control circuit 140 that is constructed in accordance with known techniques to generate the operation control signals described below. A match line output circuit 150 is connected to each match line 150 for detecting "match" and "no-match" conditions and generates encoded row address output of highest priority match during search operations in accordance with known techniques. Referring to a lower portion of FIG. 1, connected to each pair of bit lines is a refresh circuit (RC) 160 that is controlled by control lines 141 and 142 in accordance with the operations described below. Finally, located at the upper portion of FIG. 1, a precharge circuit 170 is connected to each bit line of the array to precharge each of the bit lines in accordance with the operations described below.

Figure 2:
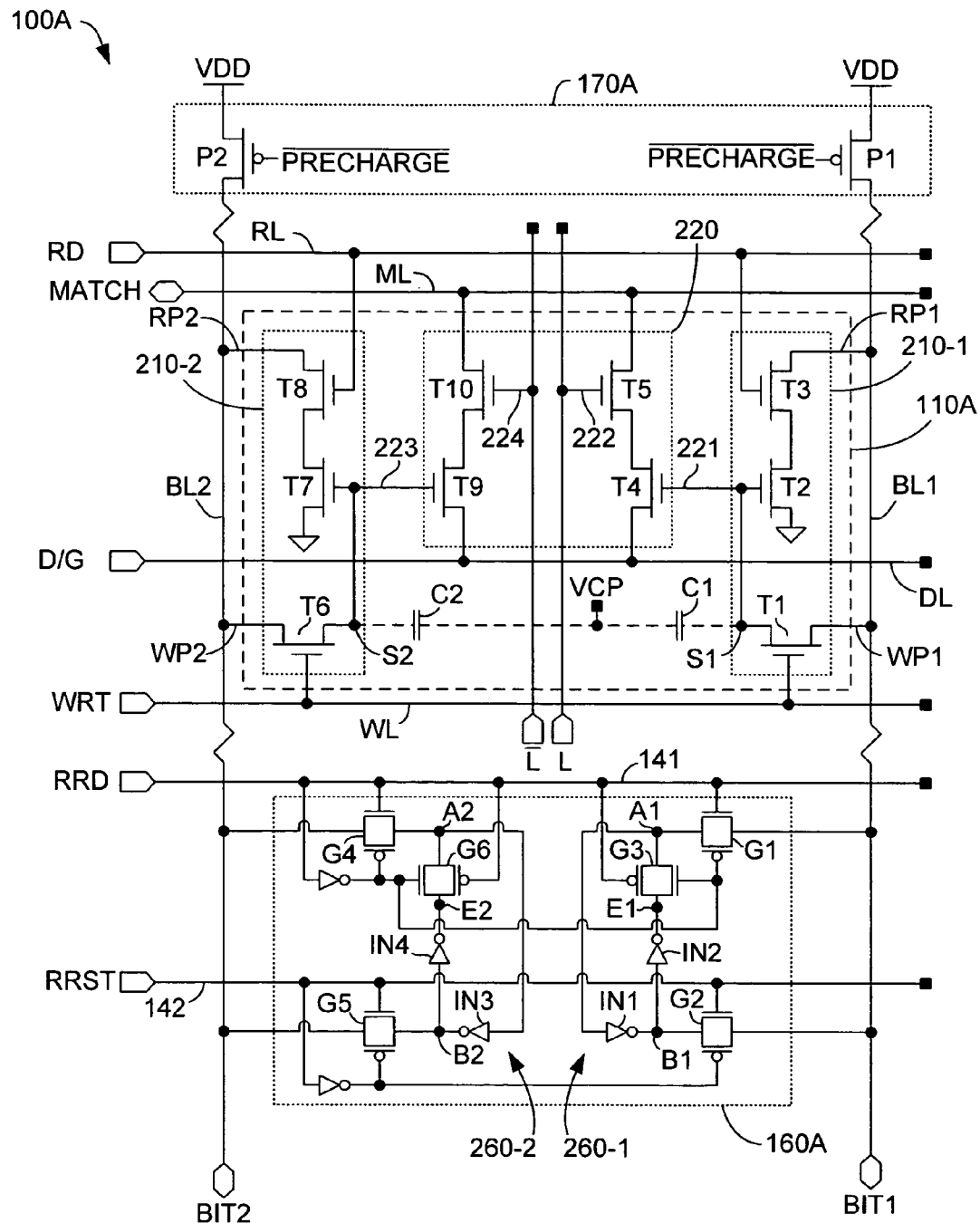
FIG. 2 is a schematic diagram showing a portion of a CAM cell array including a ternary CAM cell formed in accordance with a first embodiment of the present invention.

FIG. 2 is a schematic diagram showing a portion of a ternary CAM cell array 100A according to a first embodiment of the present invention. CAM cell array 100A includes multiple 10T CAM cells 110A (one shown) arrayed in the manner indicated in FIG. 1, each CAM cell 110A being connected to an associated pair of bit lines BL1 and BL2, associated true and complement lookup lines L and L-bar, an associated match line ML, an associated write word line WL, an associated read word line RL, and an associated optional discharge line DL. Connected to associated bit lines BL1 and BL2, and located at the lower end of the column of CAM cells that includes CAM cell 110A, is a refresh circuit 160A. Similarly, connected to the top of each bit line BL1 and BL2 is a precharge circuit 170A.

Referring to the center of FIG. 2, each 10T CAM cell 110A includes a (first) 3T dynamic random access memory (DRAM) cell 210-1 having a first storage node S1 for storing a first bit of a two-bit data value, a (second) 3T DRAM cell 210-2 having a second storage node S2 for storing a second bit of the data value, and a 4T comparator circuit 220 for discharging an associated match line ML to a discharge line (which is pulled to ground during search operations) when a two-bit complementary data value (unmasked data) applied on lookup lines L and L-bar is not equal to the complementary (unmasked) two-bit data value stored on storage nodes S1 and S2, as described below.

Referring to the right side of CAM cell 110A, DRAM cell 210-1 includes a write (first) transistor T1, a pull-down (second) transistor T2, and a read (third) transistor T3. Write transistor T1 is connected between storage node S1 and a (first) write port WP1, which is connected to bit line BL1, and has a gate terminal connected to (controlled by) write word line WL. Pull-down transistor T2 includes a gate terminal connected to storage node S1, a first terminal connected to ground, and a second terminal connected to read transistor T3. Read transistor T3 is connected between the second terminal of pull-down transistor T2 and a (first) read port RP1, which is connected to bit line BL1, and has a gate terminal connected to (controlled by) read word line RL.

Referring to the left side of FIG. 2, second DRAM cell 210-2 is similar to first DRAM cell 210-1 in that it includes a write (sixth) transistor T6, a pull-down (seventh) transistor T7, and a read (eighth) transistor T8. Write transistor T6 is connected between a (second) write port WP2, which is connected to associated bit line BL2, and storage node S2, and has a gate terminal connected to write word line WL. Storage node S2 is connected to the gate terminal of pull-down transistor T7, which is connected between read transistor T8 and ground. Finally, read transistor T8 is connected between pull-down transistor T7 and a (second) read port RP2, which is connected to associated bit line BL2.

Logic XOR-type comparator 220 is located between DRAM cells 210-1 and 210-2, and includes a first input terminal 221 connected to storage node S1 of DRAM cell 210-1, a second input terminal 222 connected to receive a true (non-inverted) bit of the applied data value transmitted on lookup line L, a third input terminal 223 connected to storage node S2, and a fourth input terminal 224 connected to receive an inverted bit of the applied data value transmitted on inverted lookup line L-bar. Comparator 220 includes a pull-down (fourth) transistor T4 connected in series with a search (fifth) transistor T5 between associated match line ML and discharge line DL (or ground). A gate terminal of pull-down transistor T4 is connected via first input terminal 221 to storage node S1. A gate terminal of search transistor T5 is connected to second input terminal 222 of comparator circuit 220. Accordingly, during search operations, pull-down transistor T4 and search transistor T5 turn on to discharge match line ML when both the data bit applied to first input terminal 221 (i.e., the data bit stored at storage node S1) and the data bit applied to second input terminal 222 (i.e., the true bit of the searched-for data value on lookup line L) are logic "one" (high voltage) data values. Comparator 220 also includes a pull-down (ninth) transistor T9 connected in series with a search (tenth) transistor T10 between associated match line ML and discharge line DL (or ground). A gate terminal of pull-down transistor T9 is connected via third input terminal 223 to storage node S2. A gate terminal of search transistor T10 is connected to fourth input terminal 224. Accordingly, during search operations, pull-down transistor T9 and search transistor T10 turn on to discharge match line ML when both the data value applied to third input terminal 223 (i.e., the data bit stored at storage node S2) and the data bit applied to fourth input terminal 224 (i.e., the inverted bit of the searched-for data value on inverted lookup line L-bar) are logic "one" (high voltage) data values.

In accordance with an embodiment of the present invention, both storage nodes S1 and S2 are formed by intrinsic capacitance produced primarily but not entirely by the gate to channel capacitance of the pull-down transistors respectively forming these nodes. For example, storage node S1 is formed primarily by the gate to channel capacitance of pull-down transistors T2 and T4. Similarly, storage node S2 is formed primarily by the gate to channel capacitance of pull-down transistors T7 and T9. These intrinsic capacitances are sufficient to avoid the need for a discrete capacitor structure that typically requires a complex, triple layer polysilicon fabrication process. Accordingly, although 3T DRAM cell 210-1 or 210-2 is substantially larger than a conventional 1T DRAM cell, the fabrication process required to produce 3T DRAM cell 110A is less complex than that required to produce conventional 1T DRAM cells. In another embodiment, an optional discrete capacitor structure C1, shown coupled to an intermediate voltage source VCP, may be utilized to enhance the capacitance of 3T DRAM cell 110A.

Referring to the lower portion of FIG. 2, refresh circuit 160A includes a first portion 260-1 connected to first bit line BL1, and a second portion 260-2 connected to second bit line BL2. First portion 260-1 includes a (first) transmission gate G1 connected between bit line BL1 and a (first) node A1, a (first) inverter IN1 connected between node A1 and a (second) node B1, a (second) transmission gate G2 connected between node B1 and bit line BL1, a (second) inverter IN2 connected between node B1 and a (third) node E1, and a (third) transmission gate G3 connected between nodes A1 and E1. Second portion 260-2 includes a (fourth) transmission gate G4 connected between bit line BL2 and a (fourth) node A2, a (third) inverter IN3 connected between node A2 and a (fifth) node B2, a (fifth) transmission gate G5 connected between node B2 and bit line BL2, a (fourth) inverter IN4 connected between node B2 and a (sixth) node E2, and a (sixth) transmission gate G6 connected between A2 and E2.

Referring to the upper portion of FIG. 2, CAM cell array 100A further includes a precharge circuit 170A including a first precharge transistor P1 connected between a system voltage source VDD and bit line BL1, and a second precharge transistor P2 connected between voltage source VDD and bit line BL2. Row control circuit 140 (see FIG. 1) generates an active-low control signal ("PRECHARGE-bar") that turns on PMOS precharge transistors P1 and P2 between read or write cycles. In other embodiments (not shown), the pre-charging of bit lines BL1 and BL2 may be omitted, and a static pull-up device may be utilized in accordance with known techniques.

During operation, ternary CAM array 100A controls the above circuits to perform write, search, and refresh operations on DRAM-based CAM cell 110A as described below.

During write and the restore portion of refresh operations, each ternary CAM cell 110A stores one of a logic "zero" data value, a logic "one" data value, or a masked (i.e., "don't care") data value that are applied to the CAM cell in the selected row of CAM cells (WL selected high) via bit lines BL1 and BL2. According to one selected convention, a logic "zero" value is stored in ternary CAM cell 110A by applying a high voltage value on bit line BL1, applying a low voltage value on bit line BL2, and then applying a high voltage value on write word line WL to turn on write transistors T1 and T6, thereby passing the high voltage value from bit line BL1 to storage node S1 and passing the low voltage value from bit line BL2 to storage node S2. The voltage level of write word line WL needs to be higher than voltage level of "high" bit line plus threshold voltage of write transistor. Conversely, a logic "one" value is stored in ternary CAM cell 110A by applying a low voltage value on bit line BL1, applying a high voltage value on bit line BL2, and then applying a high voltage value on write word line WL, thereby passing the low voltage value to storage node S1 and the high voltage value to storage node S2. A mask value is written to ternary CAM cell 110A by applying low voltages on both bit lines BL1 and BL2, and then turning on write transistors T1 and T6 to pass the low voltage values to storage nodes S1 and S2.

During subsequent search operations, the two-bit data value stored in storage nodes S1 and S2 is compared with an applied two-bit (search key) data value, which is transmitted on lookup lines L and L-bar to all CAM cells of a selected column. A logic "one" (search key) data value is applied to lookup lines L and L-bar by applying a high voltage signal to true lookup line L and a low voltage signal to inverted lookup line L-bar. Conversely, a logic "zero" is applied to lookup lines L and L-bar by applying a low voltage signal to true lookup line L and a high voltage signal to inverted lookup line L-bar. When ternary CAM cell 110A stores a logic "zero" (using the convention established above) and a logic "one" search data value is applied on the lookup lines, the high voltage at storage node S1 turns on pull-down transistor T4 (pull-down transistor T9 is turned off by the low voltage stored on storage node S2), and the high voltage transmitted on lookup line L turns on search transistor T5, thereby discharging match line ML to ground through transistors T4 and T5 (no path is opened through transistors T9 and T10). Similarly, when ternary CAM cell 110A stores a logic "one" (using the convention established above) and a logic "zero" search data value is applied on the lookup lines, the high voltage at storage node S2 turns on pull-down transistor T9 (pull-down transistor T4 is turned off by storage node S1), and the high voltage transmitted on inverted lookup line L-bar turns on search transistor T10, thereby discharging match line ML to ground through transistors T9 and T10. When the applied search value matches the stored data value (i.e., both are logic "zero" or logic "one"), or when a mask value is stored by DRAM cells 210-1 and 210-2, i.e. both storage nodes S1 and S2 are low) or when a global mask is applied to the lookup lines (i.e. both L and L-bar are low) this cell will not discharge the match line during the search operation. For example, when a logic "zero" data value is stored and a logic "zero" search value is applied, the high voltage at storage node S1 turns on pull-down transistor T4, but the low voltage transmitted on true lookup line L causes search transistor T5 to remain turned off, thereby preventing discharge of match line ML through this discharge path. Similarly, the high voltage transmitted on compliment lookup line L-bar turns on search transistor T10, but the low voltage at storage node S2 causes pull-down transistor T9 to remain turned off, thereby preventing discharge of match line ML through that discharge path. When a mask value is stored, both pull-down transistors T4 and T9 remain turned off, thereby preventing discharge of match line ML by this CAM cell no matter what search value is applied. Likewise, when a mask value is applied to the lookup lines (both low), both search transistors T5 and T10 are off, thereby preventing discharge of match line ML no matter what data is stored in the cell.

In accordance with an aspect of the present invention, each CAM cell 110A performs simultaneous refresh and search operations using only two bit lines (i.e., bit lines BL1 and BL2) for the refresh operation and two lookup lines (i.e., L and L-bar) for search operation. The simultaneous performance of refresh and search operations is made possible by choosing a storage cell in which the voltage level of the storage nodes is not disturbed during the read phase of the refresh operation (i.e., a "non-destructive" read operation) and is unaltered or enhanced during the restore phase of the refresh operation. In particular, each 3T DRAM cell 210-1 and 210-2 and corresponding portion of comparator 220 are arranged such that the stored charge is applied to the gate terminal of pull-down transistors, and is not removed during read operations. For example, storage node S1 is connected to a terminal of write transistor T1 and to the gate terminals of pull-down transistors T2 and T4. Similarly, storage node S2 is connected to a terminal of write transistor T6 and to the gate terminals of pull-down transistors T7 and T9. As described in additional detail below, the refresh operation performed in accordance with the present invention only requires write transistors T1 and T6 to turn on during the restore phase, and that the charges stored in storage nodes S1 and S2 are not "shared" (i.e., transmitted through a transistor to a bit line) during the read phase of the refresh operation. Because the charges (voltages) stored at storage nodes S1 and S2 are not shared with the bit line which is precharged to about half Vcc as in conventional DRAM, the voltages applied to pull-down transistors T4 and T9 of comparator 220 remain relatively consistent during the read phase of the refresh operation and get enhanced during the write phase of the refresh operation. Since the voltages on the gates of the pull-down transistors T4 and T9 of comparator 220 remain valid throughout a refresh operation, the refresh operation does not interfere with a simultaneous search operation allowing both to occur simultaneously.

Referring briefly to FIG. 1, during refresh operations performed in accordance with the present invention, row control circuit 140 generates control signals in cooperation with data input/output circuit 130 and precharge circuit 170 (when used) to control each CAM cell 110A (shown in FIG. 2). In particular, during refresh operations, these circuits generate coordinated control signals that cause 3T DRAM cells 210-1 and 210-2 to output inverted first and second data bits from storage nodes S1 and S2 onto bit lines BL1 and BL2, respectively, during a first operating period, to invert the inverted first and second data bits during a second operating period, and to write (restore) the re-inverted first and second data bits from bit lines BL1 and BL2 to 3T DRAM cells 210-1 and 210-2, respectively, during a third operating period. When utilized, precharge circuit 170 is activated to precharge bit lines BL1 and BL2 during non-read or non-write period. The refresh operation is described in additional detail with reference to FIGS. 3 and 4.

Figure 3:
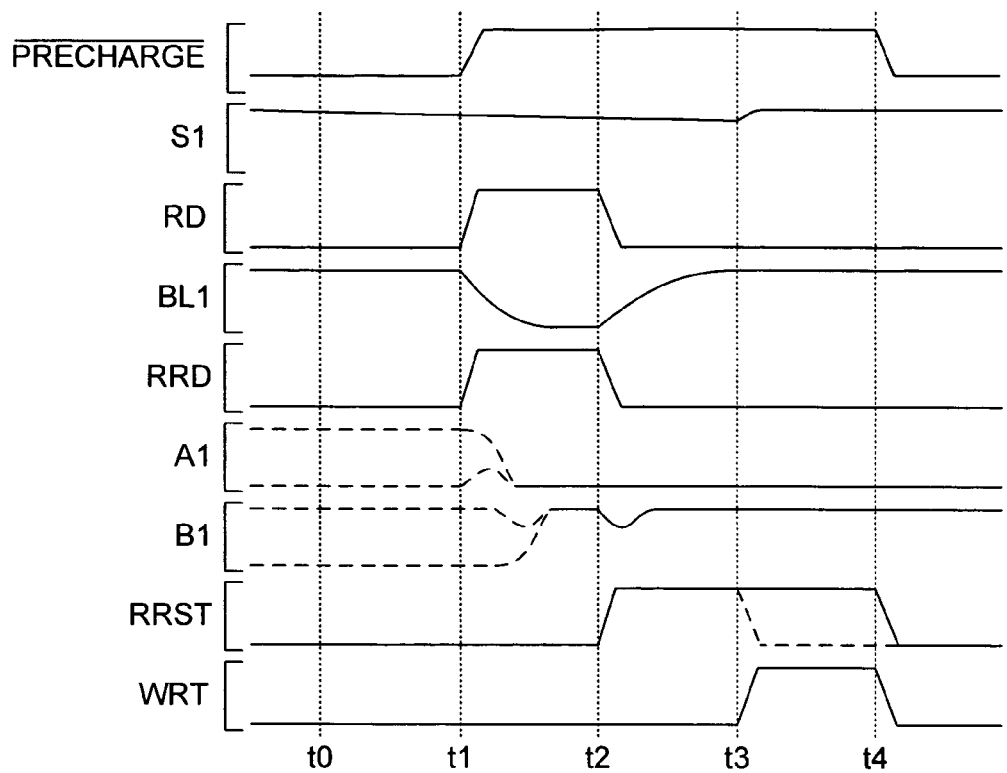
FIG. 3 is a timing diagram depicting a partial operation of the CAM cell of FIG. 2 when a 3T DRAM cell of the CAM cell stores a logic 1 (i.e., high voltage) data bit.
Figure 4:
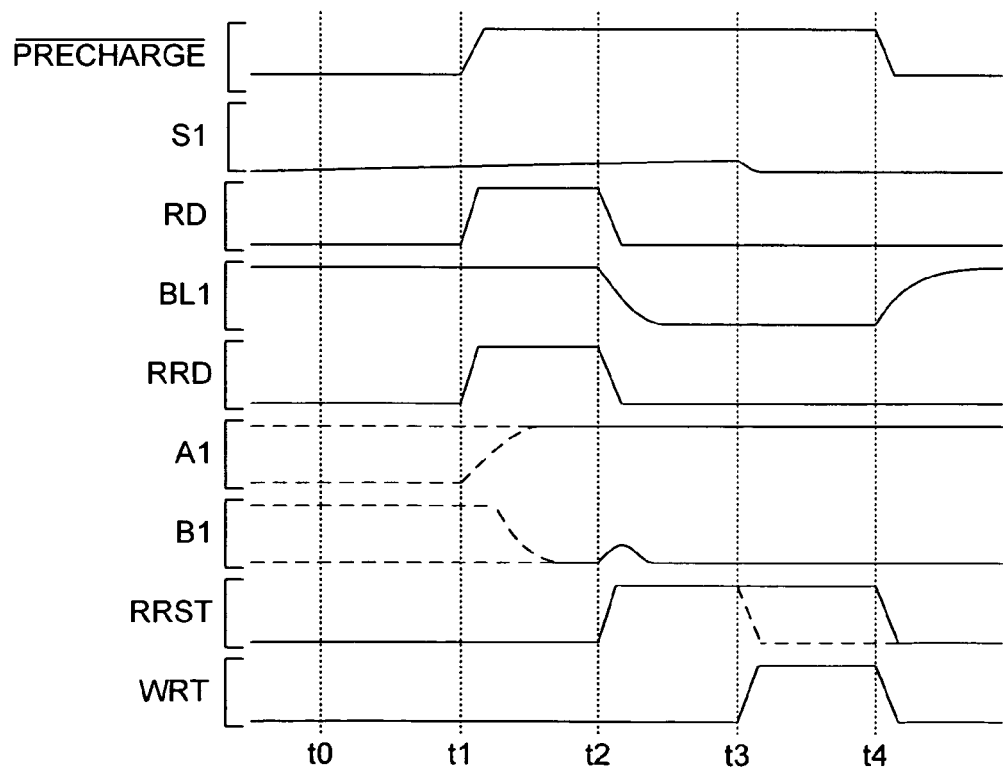
FIG. 4 is a timing diagram depicting a partial operation of the CAM cell shown in FIG. 2 when the 3T DRAM cell stores a logic 0 (i.e., low voltage) data bit.

FIGS. 3 and 4 are timing diagrams depicting refresh operations performed when storage node S1 of DRAM cell 210-1 (see FIG. 2) stores a high data bit and a low data bit, respectively. In particular, FIG. 3 indicates signal levels (i.e., either high or low) at selected nodes or structures of CAM array 100A (FIG. 2) when a high voltage signal is stored at storage node S1. Similarly, FIG. 4 indicates signal levels at the selected nodes/structures when a low voltage signal is stored at storage node S1. Note that FIGS. 3 and 4 only describe the operation of a side of CAM cell 110A controlled by 3T DRAM cell 210-1. The operation of the side controlled by 3T DRAM cell 210-2 is essentially identical, and is therefore omitted for brevity.

Referring to the top of FIG. 3, a high voltage data bit stored at storage node S1 decays over time, and therefore needs periodic refreshing. The refreshing process begins at time t1. Before time t1, precharge circuit 170 is controlled (i.e., enabled low) to precharge bit line BL1 to a high voltage level. Referring to FIG. 2, in the disclosed embodiment, row control circuit 140 forces PRECHARGE-bar signal to "low" during non-read or non-write cycles, thereby turning on PMOS transistor P1 to pass system voltage VDD onto bit line BL1 and BL2, this precharging being completed by and terminated at t1. Referring again to FIG. 3, a read phase of the refresh operation is then initiated by generating a high voltage read control signal RD on read word line RL, which turns on read transistor T3. As discussed above, the high voltage at storage node S1 maintains pull-down transistor T2 in a turned on state, so the high read control signal RD on read word line RL causes bit line BL1 to discharge through transistors T3 and T2 to ground during the time interval t1 to t2. In this manner an inverted form of the data bit stored at storage node S1 is transferred onto bit line BL1 between times t1 and t2. From t1 to t2 refresh read line RRD is high, turning on transmission gate G1 of refresh circuit 160A (see bottom of FIG. 2), and transferring the bit line voltage onto node A1. Accordingly, the inverted (low voltage) data bit is passed from bit line BL1 to node A1 of refresh circuit 160A, and is then re-inverted by inverter IN1 and applied to data node B1 as a high voltage signal. In this manner, turning on transmission gate G1 causes the true (i.e., non-inverted) data bit stored at storage node S1 to be generated at node B1 by time t2. At time t2, both refresh read control signal RRD and read word control signal RD are toggled low. When refresh read control signal goes low, the transmission gate G3 is turned on and latches the read data. Transmission gate G2 is turned on during a (third) period between times t2 and t3 by toggling refresh restore control signal RRST high, thereby transferring the data bit from node B1 to bit line BL1, this transfer being substantially complete by t3. Subsequently, at time t3, write control signal WRT is toggled high, which turns on write transistor T1 of DRAM cell 210-1 to pass the full $V_{DD}$ voltage level from bit line BL1 to storage node S1, thereby refreshing storage node S1 to a full $V_{DD}$ voltage level. At time t4, write control signal WRT is toggled low, completing the refresh operation. Refresh restore control signal RRST is toggled low at either t3 or at t4 (as shown).

FIG. 4 illustrates a refresh operation when a low voltage signal is stored at storage node S1. Similar to the case described above, precharge circuit 170 is controlled (active low) to precharge bit line BL1 to a high voltage level before time t1. At time t1, the precharge is terminated and the read phase is then initiated by generating a high voltage read control signal RD on read word line RL, which turns on read transistor T3. As discussed above, the low voltage signal at storage node S1 maintains pull-down transistor T2 in a turned off state, so bit line BL1 remains high (i.e., does not discharge through transistors T3 and T2), thereby again establishing an inverted form of the data bit stored at storage node S1 onto bit line BL1. At this time refresh read control signal RRD is also toggled high, thereby turning on transmission gate G1 to pass the inverted (high voltage) data bit to node A1, which is subsequently re-inverted by inverter IN1 and applied to data node B1 as a low voltage signal. At time t2, both read control signal RD and refresh read control signal RRD are turned off (low), and transmission gate G2 is turned on by toggling refresh restore control signal RRST high, thereby transferring the low data bit from node B1 to bit line BL1. Subsequently, at time t3, write word line WL is toggled high, which turns on write transistor T1 of DRAM cell 210-1 to pass the low data bit from bit line BL1 to storage node S1, thereby refreshing storage node S1. Refresh restore control signal RRST is toggled low at t3 (as shown) or t4. At time t4, write control signal W is toggled low to complete the refresh cycle.

As mentioned above, essentially identical refresh operations are performed for data bits stored at storage node S2 of DRAM cell 210-2. In particular, the stored data bit is inverted and passed to bit line BL2, passed by transmission gate G4 to node A2 of refresh circuit 160A, re-inverted by inverter IN3, then passed from node B2 through transmission gate G45 to bit line BL2, and finally passed from bit line BL2 to storage node S2 via transmission gate T6.

As indicated in the examples illustrated in FIGS. 3 and 4, the refresh operation does not interfere with a simultaneously performed search operation. As indicated in each of these figures, the voltage on storage node S1 (and S2) is maintained valid throughout the refresh operation, so that the search operation is performed as described above.

Further, as set forth above, the refresh operation for CAM cell 110A is entirely performed using only two bit lines (i.e., BL1 and BL2), thereby reducing the substrate space required to fabricate CAM cell 110A when compared with conventional 10T CAM cells requiring four bit lines.

In accordance with one embodiment, write word line WL (see FIG. 2) is bootstrapped above the power supply voltage using known techniques to pass the full high voltage from the bit line to the storage node S1. Similarly, transmission gates G1 through G6 may be NMOS transistors with their gates being driven to bootstrapped voltage levels.

In addition, discharge line DL is pulled high at the same time that match line ML is precharged high to allow lookup lines L and L-bar to maintain their previously applied signal levels. If discharge line DL were held low as match line were precharged high for example, high voltage signals on discharge line DL and at storage node S1 would establish a path through transistors T4 and T5, thereby causing a significant power dissipation during the match line precharge operation. To prevent this power dissipation, discharge line DL is pulled high during match line precharge, and then pulled low to start the search (lookup) operation only after valid search data exists on the lookup lines. In an alternative embodiment, discharge line DL may be fixed low (e.g., ground), but this would require lookup lines L and L-bar to both be cycled low during each match line precharge operation to prevent high power dissipation through comparator circuit 220. In another alternative embodiment, discharge line DL may be fixed low, and match line ML may be precharged to low level. This allows lookup data line L and L-bar to maintain previously applied value until it is driven to new value.

In accordance with one embodiment, bit line BL1 and BL2 are not discharged to ground completely during read cycle or read phase of refresh cycle. It may take a long time for series transistors T2 and T3 or T7 and T8 to discharge long, high capacitive bit lines B1 and B2. Instead of simple inverters IN1 and IN3, sense amplifiers can be used with reference voltages which are slightly lower than power supply level.

Although the embodiment of FIG. 2 is suitable for most applications, the unavoidable cycling of both bit lines during refresh may present a problem in some limited power applications. In particular, referring to FIGS. 3 and 4, no matter what value is stored at storage node S1, bit line BL1 invariably cycles between high and low values during each refresh operation. In FIG. 3, when storage node S1 stores a high data bit, bit line BL1 is pulled low at time t1 when the inverted data bit is read, and cycles high at time t2 when the true data bit is passed from refresh circuit 160A to bit line BL1. Conversely, when storage node S1 stores a low data bit (FIG. 4), bit line BL1 remains high at time t1 when the inverted data bit is read, and cycles low at time t2 when the true data bit is passed from refresh circuit 160A. This cycling also occurs in bit line BL2, and the combined cycling of all of the bit lines of CAM array 100A can consume substantial power.

Figure 5:
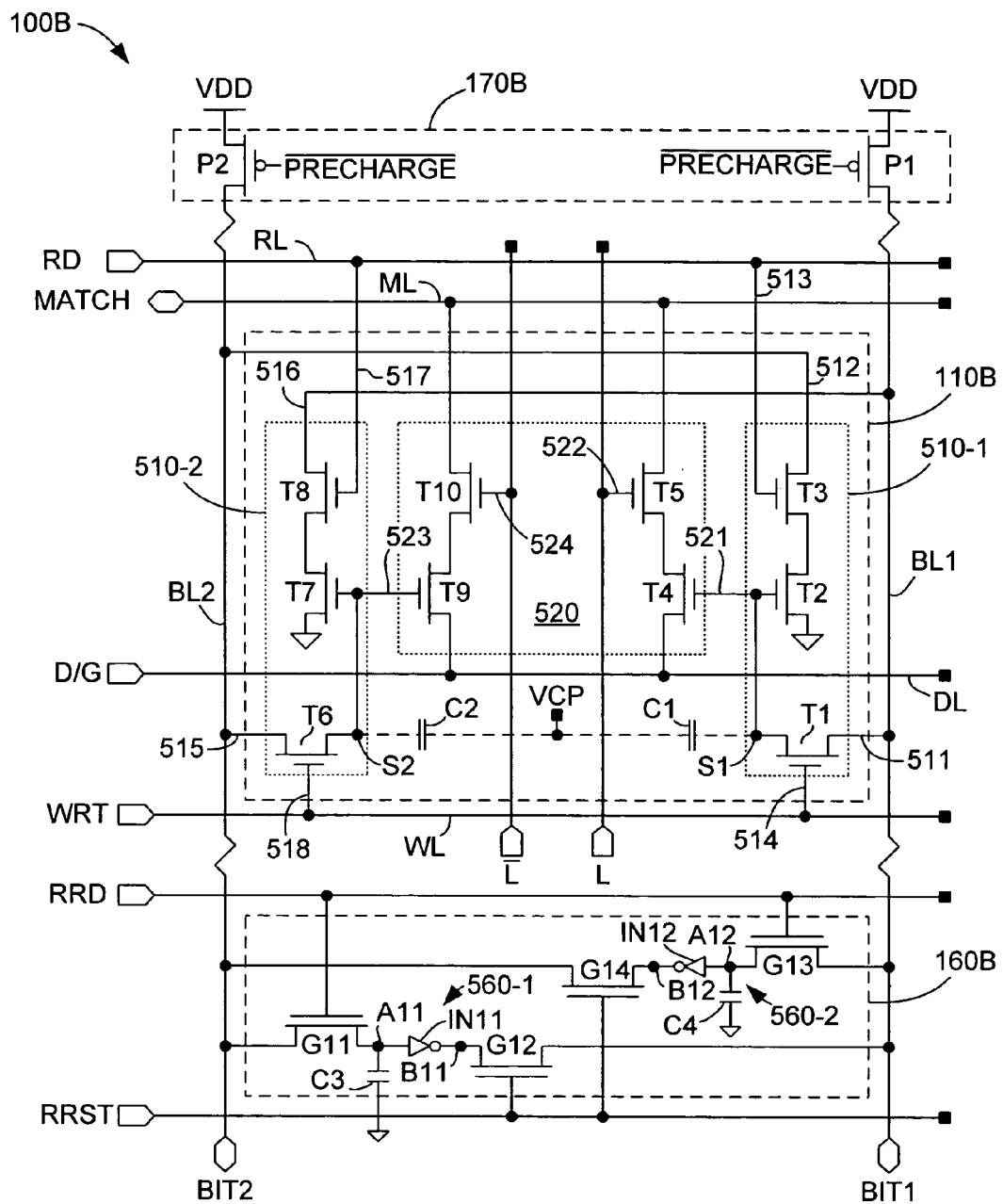
FIG. 5 is a schematic diagram showing a portion of a CAM cell array including a ternary CAM cell formed in accordance with a second embodiment of the present invention.

FIG. 5 is a schematic diagram showing a portion of a ternary CAM cell array 100B according to a second embodiment of the present invention that addresses the cycling problem of the first embodiment (described above) by providing a CAM cell 110B having cross-coupled DRAM cells 510-1 and 510-2, which reduces the cycling of bit lines BL1 and BL2 in the manner described below. In addition, CAM cell array 100B includes a refresh circuit 160B that includes inverting structures 560-1 and 560-2, which are described in additional detail below. Other structures of CAM cell array 100B that are similar to those described above with reference to CAM cell array 100A (FIG. 2) are identified with like reference numerals, and are not described in detail for sake of brevity.

Similar to CAM cell 110A, CAM cell 110B includes a (first) 3T dynamic random access memory (DRAM) cell 510-1 having a first storage node S1 for storing a first data bit, a (second) 3T DRAM cell 510-2 having a second storage node S2 for storing a second data bit, and a 4T comparator circuit 520 for discharging an associated match line ML to discharge line DL when complementary (unmasked) data applied on lookup lines L-bar and L is not equal to complimentary (unmasked) data stored at storage nodes S1 and S2, respectively.

Unlike CAM cell 110A, however, the read and write transistors of DRAM cells 510-1 and 510-2 are cross-coupled between bit lines BL1 and BL2. Referring to the right side of CAM cell 110B, DRAM cell 510-1 includes a write transistor T1 connected between storage node S1 and bit line BL1 via a first write port 511, a pull-down transistor T2 including a gate terminal connected to storage node S1, a first terminal connected to ground, and a second terminal connected to read transistor T3, and a read transistor T3 is connected between the second terminal of pull-down transistor T2 and (the other) bit line BL2 via a first read port 512. Similarly, second DRAM cell 510-2 includes a write transistor T6 connected between bit line BL2 (via a second write port 515) and storage node S2, a pull-down transistor T7 connected between read transistor T8 and ground, and a read transistor T8 connected between pull-down transistor T7 and bit line BL1 (via a second read port 516).

Similar to comparator 220 (FIG. 2), comparator 520 includes a first input terminal 521 connected to storage node S1 of DRAM cell 210-1, a second input terminal 522 connected to lookup line L, a third input terminal 523 connected to storage node S2, and a fourth input terminal 524 connected to inverted lookup line L-bar. Comparator 520 includes a pull-down transistor T4 connected in series with a search transistor T5 between associated match line ML and discharge line DL (or ground), with a gate terminal of pull-down transistor T4 connected to storage node S1, and a gate terminal of search transistor T5 connected to second input terminal 522. Accordingly, during search operations, pull-down transistor T4 and search transistor T5 both turn on to discharge match line ML when both the data bit applied to first input terminal 521 and the data bit applied to second input terminal 522 are high voltage signals. Comparator 520 also includes a pull-down transistor T9 connected in series with a search transistor T10 between associated match line ML and discharge line DL (or ground), with a gate terminal of pull-down transistor T9 connected to storage node S2, and a gate terminal of search transistor T10 connected to fourth input terminal 524. During search operations, pull-down transistor T9 and search transistor T10 both turn on to discharge match line ML when both the data bit applied to third input terminal 523 and the data bit applied to fourth input terminal 524 are high voltage signals.

Referring to the lower portion of FIG. 5, refresh circuit 160B includes a first portion 560-1 and a second portion 560-2 connected between bit lines BL1 and BL2. First portion 560-1 includes a (first) transmission gate G11 connected between bit line BL2 and a (first) node A11, a (first) inverter IN1 connected between node A11 and a (second) node B11, and a (second) transmission gate G12 connected between node B11 and bit line BL1. A storage capacitor C3 is provided to temporarily store data values transmitted to node A11 (i.e., to the input terminal of inverter IN1). Second portion 560-2 includes a (third) transmission gate G13 connected between bit line BL1 and a (third) node A12, a (second) inverter IN12 connected between node A12 and a (fourth) node B12, and a (fourth) transmission gate G14 connected between node B12 and bit line BL2. Another storage capacitor C4 is provided to temporarily store data values transmitted to node A12 (i.e., to the input terminal of inverter IN12). In one embodiment, similar to the transmission gates of the first embodiment, transmission gates G11 through G14 are CMOS transmission gates generated in accordance with known techniques.

During operation, a CAM array containing multiple CAM cells 110B is controlled to perform write, search, and refresh operations on the DRAM-based CAM cells 110B as described below. Write operations and search operations are performed essentially as described above with reference to CAM array 100A (see FIG. 2), and therefore will not be repeated here.

Similar to CAM cell 110A, each CAM cell 110B performs simultaneous refresh and search operations using only two bit lines (i.e., bit lines BL1 and BL2) and two data lines L and L-bar. However, as set forth below, CAM array 100B reduces bit line cycling during refresh through the use of cross-coupled inverting refresh circuit 160B and the cross-coupled DRAM cells of CAM cell 110B.

Figure 7:
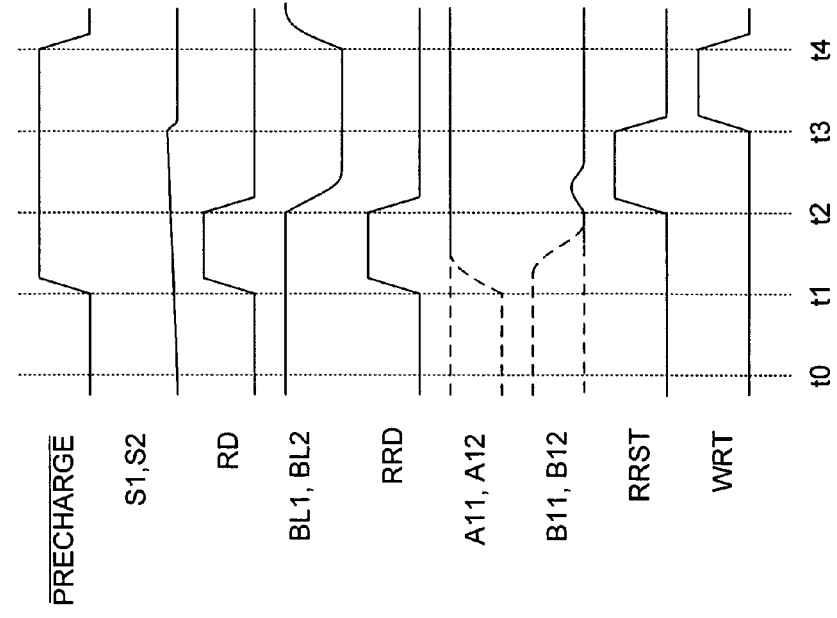
FIG. 7 is a timing diagram depicting the partial operation of the ternary CAM cell shown in FIG. 5 when the 3T DRAM cells store a mask (don't care) data value.
Figure 6:
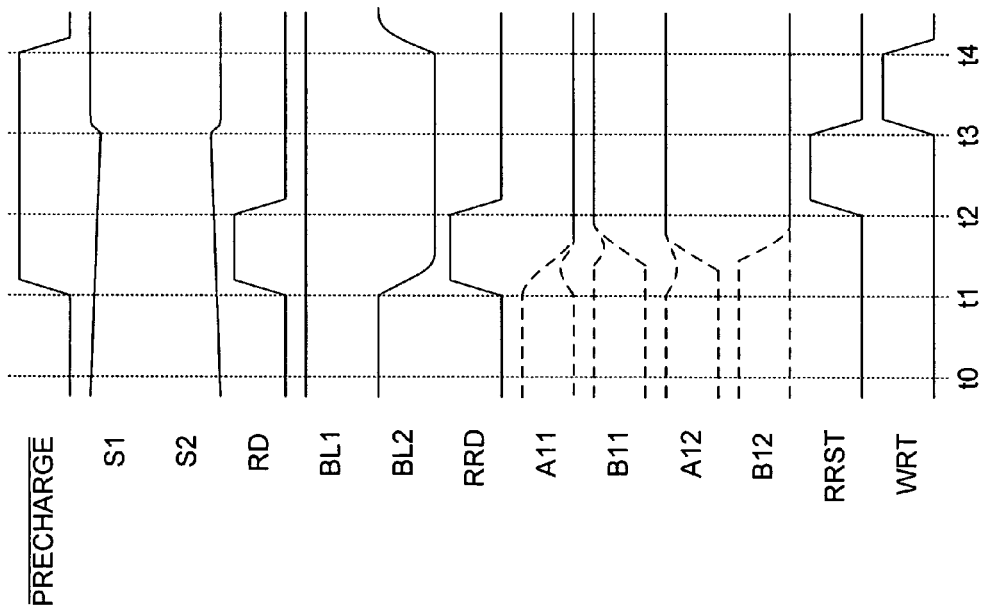
FIG. 6 is a timing diagram depicting the operation of the ternary CAM cell of FIG. 5 when the 3T DRAM cells store complimentary data bits.

The refresh operation of CAM array 100B is described in additional detail with reference to timing diagrams provided in FIGS. 6 and 7. FIG. 6 illustrates a refresh operation associated with a first (very common unmasked) case in which a high voltage data bit is stored in storage node S1 and a low voltage data bit is stored in storage node S2. The description associated with FIG. 6 is essentially mirrored in the opposite (very common unmasked) case (i.e., when storage node S1 stores a low voltage and storage node S2 stores a high voltage), so this opposite case will not be described for brevity. FIG. 7 illustrates a refresh operation associated with a second (relatively uncommon mask) case in which a low voltage is stored in both storage nodes S1 and S2.

Referring to the top of FIG. 6, a high voltage data bit is stored at storage node S1, and a low voltage data bit is stored at storage node S2. The refreshing process begins at time t1. Before time t1, precharge circuit 170B is controlled (active low) to precharge bit lines BL1 and BL2 to high voltage levels. Precharge is terminated and a read phase is then initiated at time t1 by generating a high voltage read control signal RD on read word line RL, which turns on read transistors T3 and T8 (of the row of CAM cells being refreshed), thereby causing bit line BL2 to discharge since both T2 and T3 are conductive (bit line BL1 remains charged due to the low voltage stored at storage node S2). Also at time t1, a refresh read control signal RRD is toggled high, thereby turning on transmission gates G11 and G13 of refresh circuit 160B (see bottom of FIG. 5). Accordingly, the inverted data bits are passed from bit lines BL2 and BL1 to nodes A11 and A12, respectively, and are then re-inverted by inverters IN11 and IN12 and applied to data nodes B11 and B12, respectively. At time t2, both read control signal RD and refresh read control signal RRD are toggled low, after which transmission gates G12 and G14 are turned on by toggling refresh restore control signal RRST high, thereby transferring the re-inverted data bits from nodes B11 and B12 to bit lines BL1 and BL2, respectively. Of particular note, in this very common (unmasked) case in which the storage nodes have opposite data, when the refresh restore control signal RRST is driven high, neither bit line voltage changes. Bit line BL1 was already at the same voltage as B11 (high in this example) and bit line BL2 was already at the same voltage as B12 (low in this example). Only one of the two bit lines (BL2 in this example) toggles low during the refresh cycle. The other remains at its high precharge voltage. This saves considerable power compared to refreshing the cell of FIG. 2. At time t3, refresh restore control signal RRST is toggled low, and write control signal WRT is toggled high, which turns on write transistors T1 and T6 to pass the full voltage levels from bit lines BL1 and BL2 to storage nodes S1 and S2, thereby completing the refresh process. At time t4, write control signal WRT is toggled low. Note that during the entire refresh process, storage node S1 remains high and storage node S2 remains low so search operations can proceed during refresh.

FIG. 7 illustrates the case where a mask value is stored in CAM cell 110B (i.e., both voltages stored at storage nodes S1 and S2 are low). Before time t1, bit lines BL1 and BL2 are precharged to high voltage levels in the manner described above. Between times t1 and t2, a high voltage control signal RD turns on read transistors T3 and T8. Note that neither bit line BL1 nor bit line BL2 discharges due to the low voltage stored at storage nodes S1 and S2). At the same time, refresh read control signal RRD is toggled high to turn on transmission gates G11 and G13, thereby passing the high voltage bit line signals to nodes A11 and A12, respectively, which are then re-inverted by inverters IN11 and IN12, and the resulting low voltage signals are applied to data nodes B11 and B12, respectively. Transmission gates G12 and G14 are turned on between times t2 and t3 to transfer the low data bits from nodes B11 and B12 to bit lines BL1 and BL2, respectively. Subsequently, between times t3 and t4, write control signal WRT is toggled high, which turns on write transistors T1 and T6 to pass the low voltage signals from bit lines BL1 and BL2 to storage nodes S1 and S2, respectively, thereby completing the refresh process.

As in the first embodiment, the examples illustrated in FIGS. 6 and 7 show that the read phase of the refresh operation does not interfere with a simultaneously performed search operation. Further, as set forth above, the refresh operation for CAM cell 110A is entirely performed using only two bit lines (i.e., BL1 and BL2).

Moreover, the cross-coupled arrangement of CAM array 100B reduces bit line cycling, thereby reducing power consumption over the embodiment shown in FIG. 2. As indicated in FIG. 6, when complementary voltage levels are stored at storage nodes S1 and S2, only one bit line (e.g., BL2 in the example shown in FIG. 6) cycles during the refresh operation, while the other (e.g., bit line BL1) remains at a high level, thereby reducing power dissipation when compared with the embodiment of FIG. 2, in which both bit lines are always cycled during refresh operations.

Figure 8:
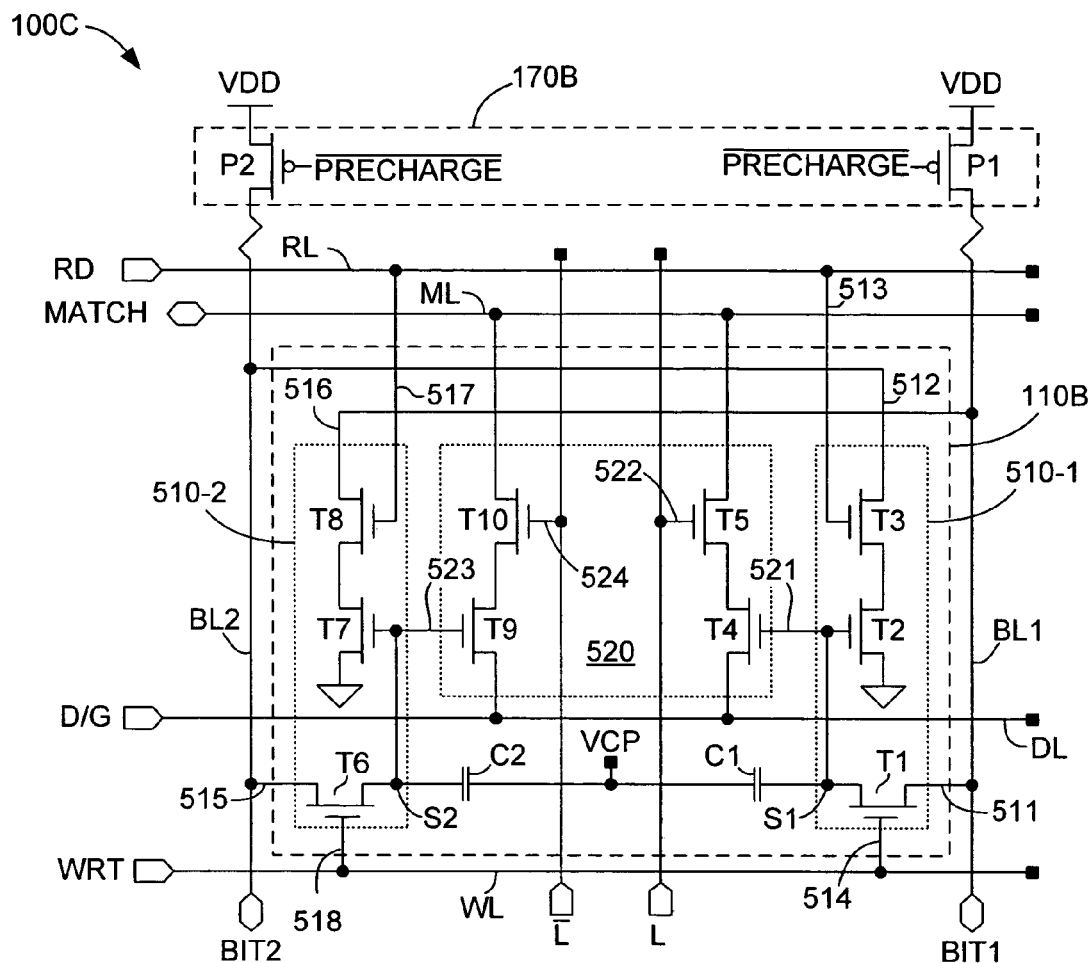
FIG. 8 is a schematic diagram showing a portion of a CAM cell array including a binary CAM cell formed in accordance with a third embodiment of the present invention.

CAM cell 110B is not limited to use in ternary CAM arrays, such as CAM array 100B (shown in FIG. 5). Inverting refresh circuit 160B of CAM array 100B may be omitted if storage nodes S1 and S2 always contain complementary data (i.e. no mask condition is allowed—the cell is a binary cell). Accordingly, FIG. 8 is a schematic diagram showing a portion of a binary CAM cell array 100C according to a third embodiment of the present invention. As indicated in FIG. 8, binary CAM cell array 100C includes an array of CAM cells 110B (described above with reference to FIG. 5), but omits inverting refresh circuit 160B that is used in ternary CAM cell 100B. Because the structure and associated signal and control lines of binary CAM cell array 100C is otherwise the same as that of ternary CAM cell array 100B, a description thereof is omitted for brevity.

During operation, binary CAM array 100C performs write, search, and refresh operations on DRAM-based CAM cell 110B as described below. Write operations and search operations are performed essentially as described above with reference to CAM array 100A and 100B (see FIGS. 2 and 5), and therefore will not be repeated here. In addition, similar to the operation of ternary CAM array 100B, binary CAM array 100C performs simultaneous refresh and search operations using only two bit lines (i.e., bit lines BL1 and BL2), and two data lines (i.e., data lines L and L-bar), and facilitates reduced bit line cycling in the manner described above with reference to FIG. 7. However, as is characteristic of binary CAM arrays, CAM array 100C does not support mask (don't care) operations, which are described above with reference to FIG. 8.

When the circuit 100C of FIG. 8 is operated as a binary CAM array (i.e., complementary bits are stored at storage nodes S1 and S2), due to the cross-coupling structure of CAM cell 110B, the read phase of the refresh operation automatically generates correct refresh voltages on bit lines BL1 and BL2 for the subsequent write phase. For example, the high voltage at storage node S1 generates a low voltage on bit line BL2 during the read phase, which is the correct voltage for writing to storage node S2 during the write phase. In this case the waveforms of FIG. 6 apply except that nodes A11, B11, A12, B12 and Refresh Restore Control Signal RRST as well as refresh read line RRD are not needed.

In addition to the CAM array embodiments described above, the cross-coupled 3T DRAM arrangement of the second and third embodiments may also be beneficially utilized in conventional 3T Cell DRAM circuits.

Figure 9:
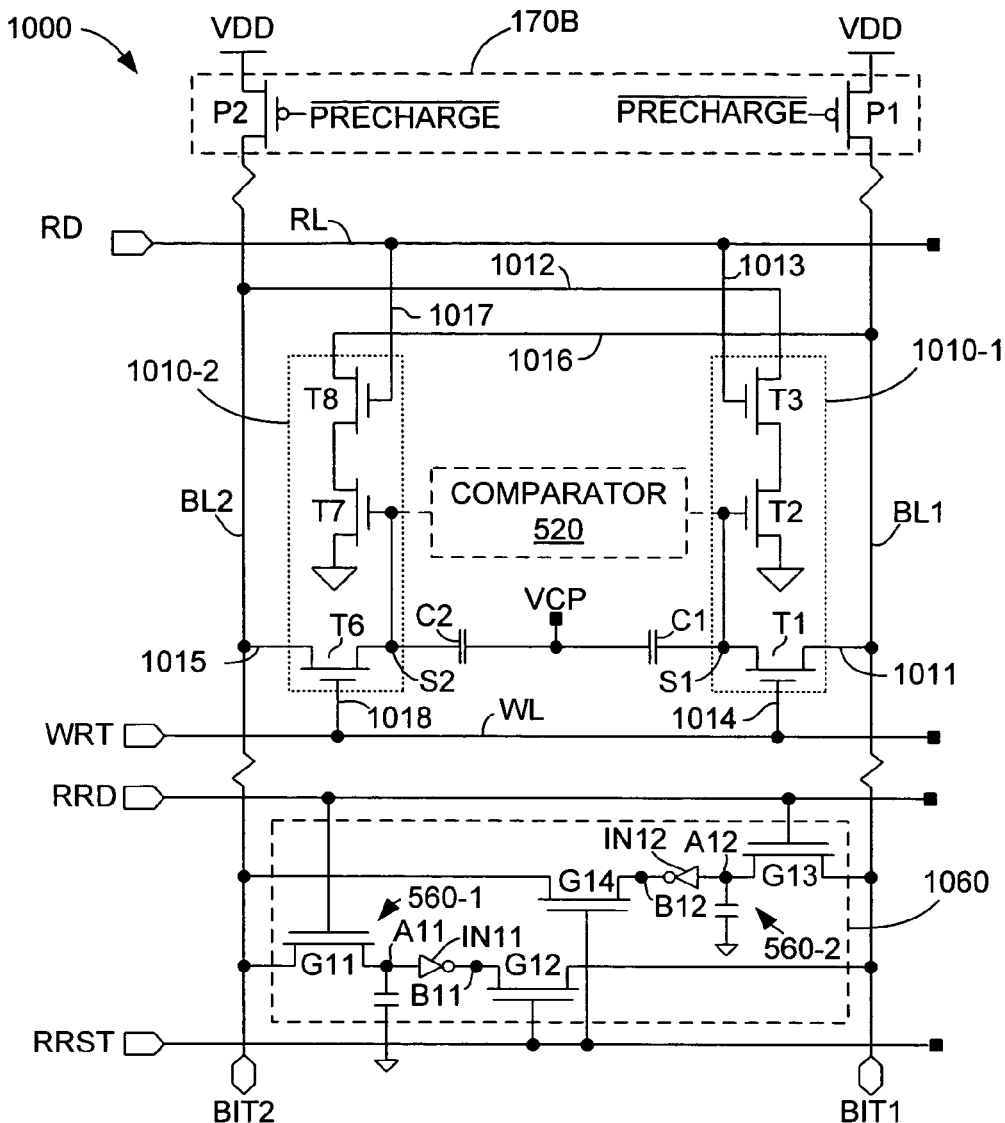
FIG. 9 is a schematic diagram showing a portion of a memory array in accordance with yet another embodiment of the present invention.
Figure 10:
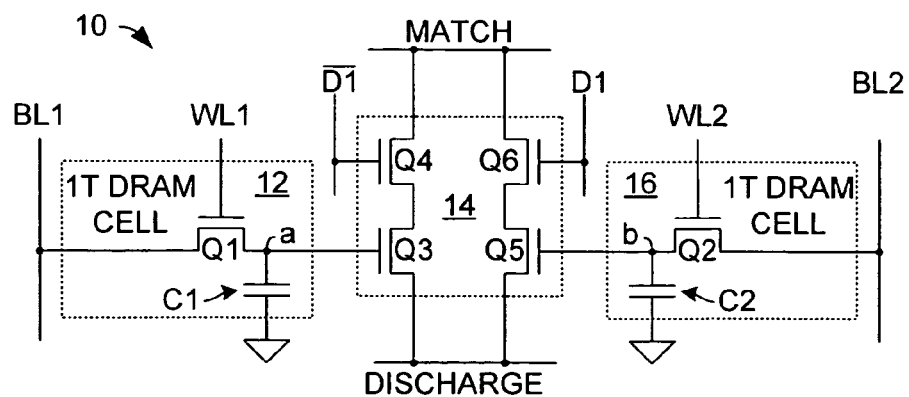
FIG. 10 is a schematic diagram showing a conventional DRAM-based CAM cell.

FIG. 9 is a schematic diagram showing two independent bits of a dynamic random access memory cell array, bits 1010-1 and 1010-2 according to a fourth embodiment of the present invention. As indicated in FIG. 9, DRAM array 1000 includes an array of 3T DRAM cells 1010-1 and 1010-2, which are similar to DRAM cells 510-1 and 520-2 of ternary CAM cell 100B (see FIG. 5). Like ternary CAM cell 100B, 3T DRAM cells 1010-1 and 1010-2 are cross-coupled to bit lines BL1 and BL2. In particular, first 3T DRAM cell 1010-1 includes a write transistor T1 connected to bit line BL1 via first write port 1011 and read transistor T3 connected to bit line BL2 via first read port 1012. Conversely, second totally independent 3T DRAM cell 1010-2 includes a write transistor T6 connected to bit line BL2 via second write port 1015 and read transistor T8 connected to bit line BL1 via second read port 1016. Note that read transistors T3 and T8 are controlled by read word line RL via read control ports 1013 and 1017, respectively, and write transistors T1 and T6 are controlled by write word line WL via write control ports 1014 and 1018, respectively. Memory array 1000 also includes an inverting refresh circuit 1060 that is essentially identical to refresh circuit 160B (FIG. 5). During operation, data bits 1010-1 and 1010-2 are written to using bit lines BL1 and BL2, respectively, read from using bit lines BL2 and BL1, respectively, and refreshed in the manner described above with reference to ternary CAM cell 100B (see FIG. 5). Accordingly, memory array 1000 provides an advantage in that when associated 3T DRAM cells 1010-1 and 1010-2 store complementary bits (which statistically occurs roughly 50% of the time), only one of bit lines BL1 and BL2 is cycled during the refresh operation, thereby minimizing power consumption. Note that conventional memory array 1000 is converted into a CAM array similar to that shown in FIG. 5 by including comparator 520 having input terminals that are coupled to storage nodes S1 and S2 and data lines L and L-bar (not shown).

Although the present invention is described with reference to certain specific embodiments, several additional alternative embodiments are also possible. For example, in another embodiment the match line may be charged (instead of discharged) when mismatches occur by reversing the precharges applied to the match and discharge lines. Further, the pull-down transistors may be replaced with pull-up transistors that are connected between a high voltage source (e.g., VCC) and the read/access transistors. In view of these and other possible modifications, the invention is limited only by the following claims.

The invention claimed is:

1. A content addressable memory (CAM) cell comprising:
   a first DRAM data cell including a first read port, a first write port, and a first storage node for storing a first data value;
   a second DRAM data cell including a second read port, a second write port, and a second storage node for storing a second data value; and
   a comparator coupled to the first and second storage nodes,
   wherein the first read port is coupled to one of the first write port and the second write port.

2. The CAM cell in claim 1, wherein the first read port is coupled to the first write port.

3. The CAM cell in claim 2, wherein the second read port is coupled to the second write port.

4. The CAM cell in claim 1, wherein the first read port is coupled to the second write port.

5. The apparatus of claim 4, wherein the second read port is coupled to the first write port.

6. A content addressable memory (CAM) array comprising:
- a first DRAM data cell including a first read port, a first write port, and a first storage node for storing a first data value;
- a second DRAM data cell including a second read port, a second write port, and a second storage node for storing a second data value;
- a comparator coupled to the first and second storage nodes;
- a first bit line coupled to the first read port and one of the first write port and the second write port;
- a second bit line coupled to the second read port and one of the second write port and the first write port; and
- a refresh circuit connected to the first and second bit lines.

7. The CAM array of claim 6, wherein the first bit line is coupled to the first read port and the first write port.

8. The CAM array of claim 7, wherein the second bit line is coupled to the second read port and the second write port.

9. The CAM array of claim 6, wherein the first bit line is coupled to the first read port and the second write port.

10. The CAM array of claim 9, wherein the second bit line is coupled to the second read port and the first write port.

11. A content addressable memory (CAM) cell array comprising a plurality of CAM cells, each CAM cell including a first dynamic random access memory (DRAM) cell for storing a first bit of a data value, and a comparator circuit for discharging a match line when an applied data value fails to match the stored data value, wherein the first DRAM cell comprises:
- a first transistor connected between a storage node and a first bit line, the first transistor having a gate terminal controlled by a write word line;
- a second transistor having a gate terminal connected to the storage node, and a first terminal connected to ground; and
- a third transistor connected between a second terminal of the second transistor and the first bit line,
- wherein the storage node is connected to a first input terminal of the comparator circuit.

12. The CAM cell array according to claim 11, wherein the comparator circuit comprises a fourth transistor connected in series with a fifth transistor between the match line and a discharge line,
- wherein a gate terminal of the fourth transistor is connected to the first input terminal, and
- wherein a gate terminal of the fifth transistor comprises a second input terminal of the comparator circuit for receiving a first bit of the applied data value.

13. The CAM cell array according to claim 11, further comprising a refresh circuit including a first portion connected to the first bit line, the first portion comprising:
- a first transmission gate connected between the first bit line and a first node;
- a first inverter connected between the first node and a second node; and
- a second transmission gate connected between the second node and the first bit line.

14. A content addressable memory (CAM) cell array comprising:
- a plurality of CAM cells including a first CAM cell including a first three-transistor dynamic random access memory (3T DRAM) cell for storing a first data bit of a two-bit data value, the first 3T DRAM cell being connected to a first bit line, a second 3T DRAM cell for storing a second data bit of the two-bit data value, the second 3T DRAM cell being connected to a second bit line, and a comparator connected to the first and second 3T DRAM cells for discharging a match line when an applied complementary data value fails to match a complementary two-bit data value stored by the first and second 3T DRAM cells; and
- means for controlling the first and second 3T DRAM cells to write inverted first and second data bits onto the first and second bit lines, respectively, during a first operating period, for inverting the inverted first and second data bits, and for writing the re-inverted first and second data bits to the first and second bit lines, respectively, during a second operating period, and for writing the re-inverted first and second data bits from the first and second bit lines, respectively, onto the first and second 3T DRAM cells, respectively, during a third operating period.

15. A content addressable memory (CAM) cell array comprising a plurality of CAM cells, each CAM cell being connected to first and second associated bit lines and including a first dynamic random access memory (DRAM) cell for storing a first data bit of a two-bit data value, a second DRAM cell for storing a second data bit of the two-bit data value, and a comparator circuit for discharging a match line to a discharge line when an applied data value fails to match the two-bit data value stored by the first and second DRAM cells,
- wherein the first DRAM cell includes:
  - a first transistor connected between a storage node and the first bit line, the first transistor having a gate terminal controlled by an associated write word line;
  - a second transistor having a gate terminal connected to the storage node, and a first terminal connected to ground; and
  - a third transistor connected between a second terminal of the second transistor and the second bit line,
- wherein the storage node is connected to a first input terminal of the comparator circuit.

16. The CAM cell array according to claim 15, wherein the comparator circuit comprises a fourth transistor connected in series with a fifth transistor between the match line and the discharge line,
- wherein a gate terminal of the fourth transistor is connected to the first input terminal, and
- wherein a gate terminal of the fifth transistor comprises a second input terminal of the comparator circuit for receiving a first bit of the applied data value.

17. The CAM cell array according to claim 15, further comprising a refresh circuit including a first portion comprising:
- a first transmission gate connected between the second bit line and a first node;
- a first inverter connected between the first node and a second node; and
- a second transmission gate connected between the second node and the first bit line.

18. A content addressable memory (CAM) cell array comprising:
- a plurality of CAM cells including a first CAM cell connected to a first bit line and a second bit line, the first CAM cell including a first three-transistor dynamic random access memory (3T DRAM) cell for storing a first data bit of a two-bit data value, a second 3T DRAM for storing a second data bit of the two-bit data value, and a comparator connected to the first and second 3T DRAM cells for discharging a match line when an applied data value fails to match the two-bit data value stored by the first and second 3T DRAM cells; and means for controlling the first and second 3T DRAM cells to write data bits onto the second and first bit lines, respectively, during a first operating period, and for controlling the first and second 3T DRAM cells to subsequently write data bits from the first and second bit lines to the first and second 3T DRAM cells, respectively, thereby refreshing the data values stored in said first and second 3T DRAM cells.

19. A memory array comprising:

a first three-transistor dynamic random access memory (3T DRAM) cell for storing a first data bit, the first 3T DRAM cell having a first write transistor connected to a first bit line and a first read transistor connected to a second bit line; and a second 3T DRAM for storing a second data bit, the second 3T DRAM cell having a second write transistor connected to the second bit line and a second read transistor connected to the first bit line.

20. The memory array according to claim 19, further comprising a write word line connected to a gate terminal of the first write transistor and to a gate terminal of the second write transistor.

21. The memory array according to claim 19, further comprising a read word line connected to a gate terminal of the first read transistor and to a gate terminal of the second read transistor.

22. The memory array according to claim 19, further comprising a refresh circuit including:

a first transmission gate connected between the second bit line and a first node;

a first inverter connected between the first node and a second node;

a second transmission gate connected between the second node and the first bit line;

a third transmission gate connected between the first bit line and a third node;

a second inverter connected between the third node and a fourth node; and a fourth transmission gate connected between the fourth node and the second bit line.

23. The memory array according to claim 19, further comprising:

means for temporarily storing first and second data from the first and second bit lines, respectively; and means for generating and driving the compliments of the first and second stored data onto the second and first bit lines, respectively.

24. The memory array according to claim 19, wherein the first and second 3T DRAM cells form a content addressable memory (CAM) cell further comprising a comparator having a first terminal connected to a storage node of the first 3T DRAM cell and a second terminal connected to a storage node of the second 3T DRAM cell.

* * * * *